(12) United States Patent
Kroese et al.

(10) Patent No.: US 8,461,513 B2
(45) Date of Patent: Jun. 11, 2013

(54) METHOD AND APPARATUS FOR DEVICE WITH MINIMIZED OPTICAL CROSS-TALK

(75) Inventors: Matthew Dean Kroese, Melissa, TX (US); Todd Shannon Bishop, Denton, TX (US)

(73) Assignee: Texas Advanced Optoelectronic Solutions, Inc., Plano, TX (US)

( * ) Notice: Subject to any disclaimer, the term of this patent is extended or adjusted under 35 U.S.C. 154(b) by 396 days.

(21) Appl. No.: 12/892,256

(22) Filed: Sep. 28, 2010

(65) Prior Publication Data

US 2012/0074301 A1     Mar. 29, 2012

(51) Int. Cl.
*H01J 40/14* (2006.01)
*H01J 5/16* (2006.01)
*G01J 3/50* (2006.01)

(52) U.S. Cl.
USPC ................. 250/226; 250/208.2; 250/216

(58) Field of Classification Search
USPC ............... 250/208.1, 208.2, 216, 226, 214.1, 250/214 R, 231.13–231.18; 257/431, 432
See application file for complete search history.

(56) References Cited

U.S. PATENT DOCUMENTS

| | | | | |
|---|---|---|---|---|
| 2003/0189163 | A1* | 10/2003 | Ueyama et al. | 250/214.1 |
| 2005/0127833 | A1* | 6/2005 | Tieszen | 313/512 |
| 2005/0218306 | A1* | 10/2005 | Schmidt et al. | 250/221 |
| 2007/0071448 | A1* | 3/2007 | Zhang | 398/159 |

* cited by examiner

*Primary Examiner* — Francis M Legasse, Jr.
(74) *Attorney, Agent, or Firm* — Howison & Arnott, LLP

(57) ABSTRACT

An improved method and apparatus for a device with minimized optical cross-talk are provided. In one example, the device includes a filtering material selected to maximize the attenuation of signals causing cross-talk while minimizing the attenuation of desired signals.

11 Claims, 7 Drawing Sheets

METHOD AND APPARATUS FOR DEVICE WITH MINIMIZED OPTICAL CROSS-TALK

BACKGROUND

Integrated circuits (ICs) may include various components for use in applications such as optical sensing applications. One example of such an IC uses a package having a light emitting diode (LED) and a photodetector in order to produce and detect light. More specifically, light may be produced by the LED, strike an object, and be reflected from the object back to the photodetector. The photodetector produces a representation (e.g., an electrical signal) of the detected light that may then be processed and used as desired.

Applications such as proximity sensing, presence detection, motion detection, and color detection frequently use such optical sensing. For example, in proximity sensing, an infrared (IR) LED may be used to emit photons that reflect off of an object and are detected by an IR sensor. When there is an object within a detectable distance from a center point between the IR LED and the IR sensor, the sensor measures the reflected signal and the proximity readout is proportional to the measured light signal intensity, which is inversely proportional to the square of the distance. These signal characteristics enable the detected signal to be measured and processed based on the strength of the signal emitted from the LED. In an ideal situation, only light reflected from the object is detected by the sensor. However, non-ideal situations frequently occur in which the sensor detects light other than the reflected light, which may result in distorted measurement readings.

Accordingly, there is a need for improvements to current optical sensor packaging solutions.

BRIEF DESCRIPTION OF THE DRAWINGS

For a more complete understanding, reference is now made to the following description taken in conjunction with the accompanying Drawings in which.

DETAILED DESCRIPTION

Figure 1:
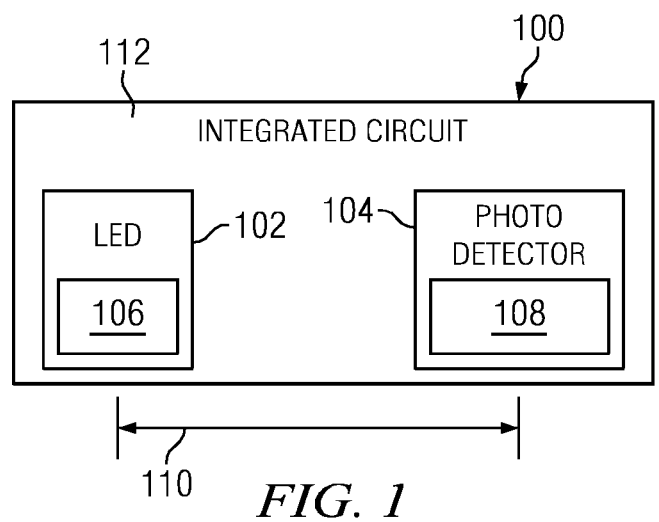
FIG. 1 is a simplified diagram of a top view of one embodiment of an integrated circuit (IC) having an emitter and a sensor positioned thereon.

The present disclosure is directed to a method and apparatus for packaging an assembly. It is understood that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
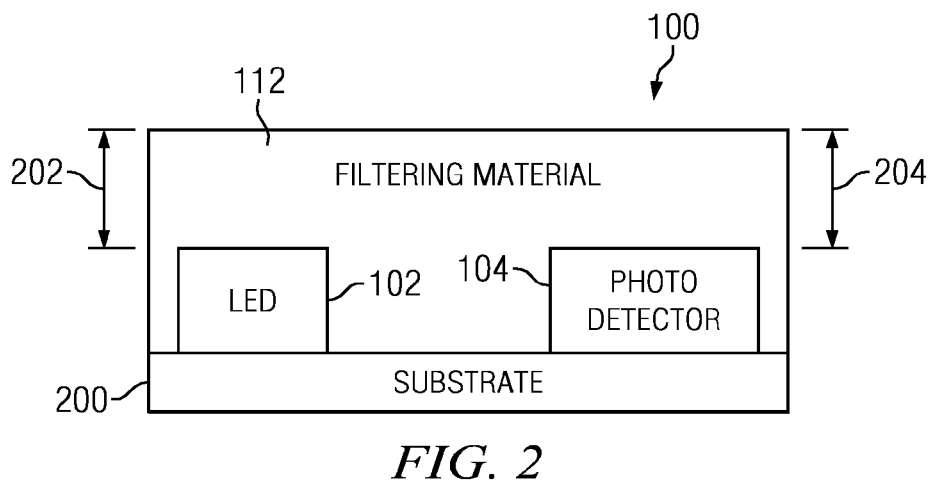
FIG. 2 is a side view of the IC of FIG. 1.

Referring to FIGS. 1 and 2, one embodiment of an integrated circuit (IC) 100 is illustrated with an emitter 102 such as a light emitting diode (LED) and a sensor 104 such as a photodetector. It is understood that the emitter 102 may be any type of emitter capable of producing a signal of any wavelength and the sensor 104 may be any type of sensor capable of sensing the signal produced by the emitter, although an LED and a photodetector are used herein as examples. The LED 102 and photodetector 104 may be positioned on or otherwise located relative to a substrate 200. For purposes of example, the IC 100 is described in the context of a proximity sensing application, but it is understood that the LED 102 and photodetector 104 may be used for many different applications and the present disclosure encompasses such applications, including but not limited to presence detection, motion detection, and color detection.

The LED 102 may be any LED capable of producing visible or non-visible light of a desired wavelength, such as a wavelength in the infrared (IR) spectrum in the range of 850 nanometers (nm) to 940 nm for a proximity sensing application. For a reflective color sensing application, the LED 102 would produce visible light and the light sensor has a filter to minimize its response to wavelengths outside the desired color band. The LED 102 may be fabricated directly onto the IC 100 or may include an IC chip or other modular component that is added to the IC 100 during or after fabrication of the IC 100. The LED 102 may be a single LED or may represent an LED array.

The photodetector 104 is configured to detect light of the wavelength produced by the LED 102 (e.g., in the range of 850 nm to 940 nm). The photodetector 104 may be fabricated directly onto the IC 100 or may include an IC chip or other modular component that is added to the IC 100 during or after fabrication of the IC 100. In some examples, the photodetector 104 may be a chip such as a TSL2711. The photodetector 104 may be a single photodetector or may represent a photodetector array.

The substrate 200 provides a structure upon which the LED 102 and photodetector 104 may be mounted. The substrate 200 may be provided by any suitable material, such as a printed circuit board, a metal lead frame, a ceramic structure, and/or other materials. Although not shown, it is understood that one or more layers or other components may be positioned between the substrate 200 and the LED 102 and photodetector 104, and that the LED 102 and photodetector 104 may not be directly coupled to the substrate 200.

A distance 110 separates a point on each of the LED 102 and photodetector 104. In the present example, the distance 110 separates a center point of a projection portion 106 of the LED 102 and a detection portion 108 of the photodetector 104. It is understood that the shapes and sizes of the projection portion 106 and detection portion 108 are for purposes of example only and that one or both portions may be sized or shaped differently from that illustrated in FIG. 1. Furthermore, one or both of the projection portion 106 and detection portion 108 may be offset from the physical center of the LED 102 and photodetector 104, respectively. In other embodiments, the upper surface of one or both of the LED 102 and photodetector 104 may be at a different height from the substrate 200 than shown, and the upper surfaces of the LED 102 and photodetector 104 may be at different heights from each other.

Some or all of the IC 100 may be covered with a filtering material 112. For example, the filtering material 112 may cover all or part of the projection portion 106 and/or detection portion 108, may be between the LED 102 and photodetector 104, and/or may cover other parts of the IC 100. As illustrated in FIG. 2, the filtering material 112 has a thickness above the LED 102 as indicated by a distance 202. The distance 202 represents the shortest path length of the light signal from the LED to the environment in which the IC 100 is placed. Likewise, the filtering material 112 has a thickness above the photodetector 104 as indicated by a distance 204. The distance 204 represents the shortest path length of the light signal entering the photodetector 104 from the environment in which the IC 100 is placed. Although the distances 202 and 204 are the same in the present example, it is understood that they may be different, with either the distance 202 or 204 being larger than the other distance.

In the present embodiment, the filtering material 112 is a resin that contains a filtering dye. It is understood that the filtering provided by the dye may be a property of the resin itself and that, in such cases, no dye may be added to the resin. The resin may be formed by a transparent or translucent plastic or any other suitable organic or inorganic material. For example, the resin may be a two-component epoxy resin with a hardener. The filtering dye provides attenuation of one or more selected wavelengths (e.g., infrared wavelengths) in the lateral direction while producing less attenuation in the vertical direction. This aids in passing light of the desired wavelengths in the preferred direction of the signal (e.g., away from the IC 100) while attenuating any undesirable components of light between the LED 102 and the photodetector 104. This is illustrated below in FIGS. 3A-3C.

Figure 3A:
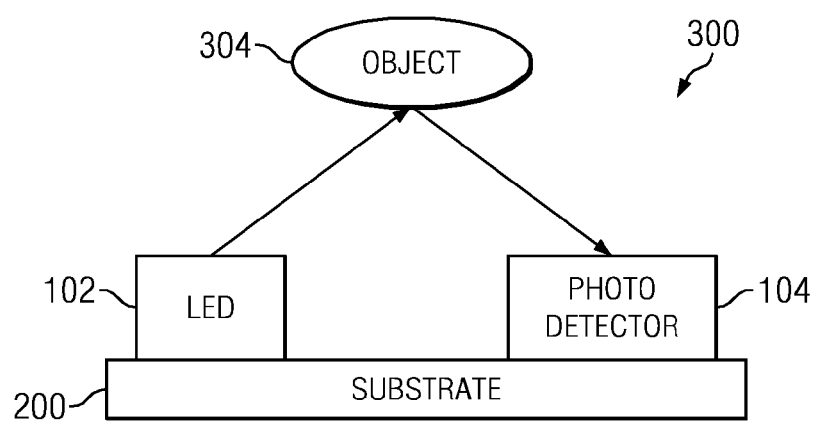
FIG. 3A illustrates one embodiment of the IC of FIG. 1 operating within an ideal environment in the absence of a filtering material on the emitter and sensor.
Figure 3B:
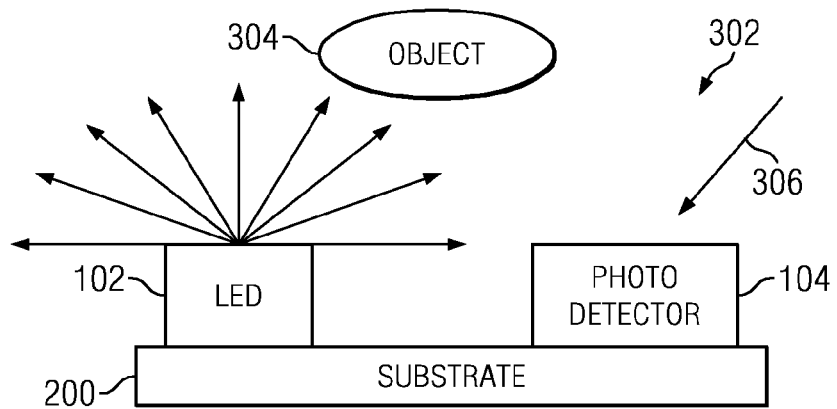
FIG. 3B illustrates one embodiment of the IC of FIG. 1 operating within a non-ideal environment in the absence of a filtering material on the emitter and sensor.

Referring to FIGS. 3A and 3B, an ideal environment 300 and an example of a realistic environment 302 are illustrated, respectively, for the LED 102 and photodetector 104 of FIGS. 1 and 2 as they may operate without the presence of the filtering material 112. In the ideal environment of FIG. 3A, the LED 102 produces light to be detected by the photodetector 104 after reflecting off an object 304. In such an ideal environment, the only light detected by the photodetector 104 would be the light produced by the LED 102 and reflected off an object in the intended direction of sensing. Accordingly, the photodetector 104 would be able to accurately measure the reflected light.

However, in the example of the realistic environment of FIG. 3B, the LED 102 produces light that is emitted in many different directions, including in the direction of the photodetector 104. This may occur, for example, in conventional LED packaging. The light path going directly from the LED 102 to the photodetector 104, as well as light that may be reflected within the packaging material itself, is typically not the intended direction of sensing. Accordingly, any such light sensed by the photodetector 104 may result in detection errors. Additionally, stray light 306 from other sources such as sunlight and ambient room lighting may be sensed by the photodetector 104 and may also cause detection errors. This unintended light that is detected by the photodetector 104 is known as optical cross-talk. Optical cross-talk may negatively impact the photodetector's performance by reducing the sensing range and may even render the photodetector non-functional.

In some conventional LED/photodetector single packages, an opaque or substantially opaque physical barrier (not shown) may be positioned between the LED 102 and the photodetector 104 to block the light from the LED 102 from traveling directly to the photodetector 104 in order to reduce the optical cross-talk between the LED 102 and the photodetector 104. The physical barrier may be made of a material such as plastic or metal and may add to the fabrication cost of an IC due to both the material needed for the physical barrier and the assembly cost for placing the physical barrier. Additionally, the use of the physical barrier may increase the size of the package.

Figure 3C:
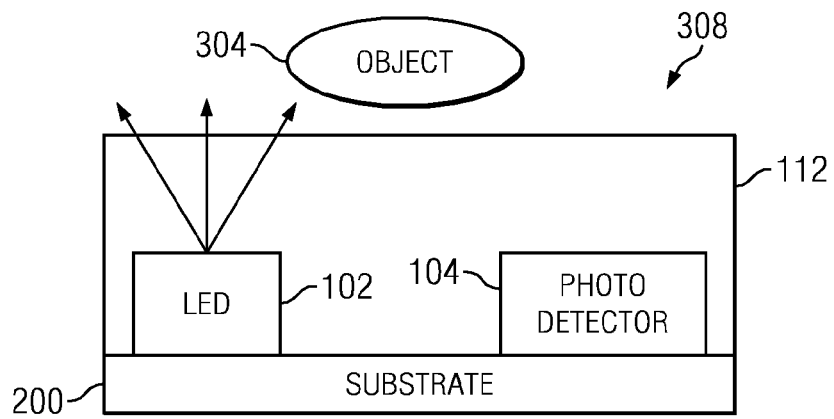
FIG. 3C illustrates one embodiment of the IC of FIG. 1 operating within a non-ideal environment in the presence of a filtering material on the emitter and sensor.

Referring to FIG. 3C, an example of a realistic environment 308 is illustrated for the LED 102 and photodetector 104 of FIGS. 1 and 2 as they may operate with the presence of the filtering material 112. The filtering material 112 attenuates light produced by the LED 102 in the lateral direction while minimizing the attenuation in the vertical direction. Accordingly, in order to minimize cross-talk, the filtering material 112 is selected to attenuate specific wavelengths produced by the LED 102, even though this negatively impacts the emission levels of desired wavelengths from the LED. For example, the filtering material 112 may include an IR blocking compound to attenuate IR transmissions from the LED 102, even though the LED 102 is an IR LED configured to produce IR light to be sensed by the photodetector 104.

Referring again to FIGS. 1 and 2, the attenuation, or alternatively the transmission, of light from the LED 102 and to the photodetector 104 is a function of the distance of each component from the top of the package and the attenuation properties (e.g., the concentration of the dye) of the filtering material 112 in accordance with Beer's Law and Lambert's law. As is known, Beer's law states that the attenuation of light is proportional to the concentration of material through which the light is passing. Lambert's law states that the attenuation of light is proportional to the length of the light path. There is a logarithmic dependence between the transmissivity of light through a material and the product of the absorption coefficient to that material and the distance the light travels through the material. Accordingly, the thickness of the filtering material 112 through which the signal must pass and the transmissivity properties of the filtering material 112 can both be used to control light attenuation.

More specifically, the attenuation provided by the filtering material 112 may be based on a number of factors, including the signal path distance through the filtering material 112 (i.e., the distance 202 and/or 204), cross-talk path distance between the LED 102 and photodetector 104 (i.e., the distance 110), and the characteristics of the dye added to the filtering material 112, such as dye type and dye concentration. The distances 110, 202, and 204, as well as the characteristics of the filtering material 112 may be varied to provide a desired level of attenuation with the understanding that certain constraints may exist.

Constraints may be physical or non-physical. For example, limits may exist on the distances 110, 202, and 204 due to design considerations of the IC 100. Rather than an ideal distance 202/204 that is infinitely thin, the minimum for one or both of the distances 202 and 204 may be constrained by the need to cover components of the IC 100 such as bonding wires coming out of the substrate 200 into either the LED 102 or the photodetector 104, by the need to provide a mechanically stable structure, and/or other considerations related to manufacturability of the package forming the IC 100. Rather than an ideal distance 110 that is infinitely wide, the maximum for the distance 110 may be constrained by an overall allowable footprint of the IC 100, such as a footprint capable of fitting within a handset device such as a cell phone.

The attenuation provided by the distances 110, 202, and 204 may also be impacted by the attenuation properties of the filtering material 112, which may in turn be impacted by cost, the suitability of certain resins, and/or other factors. For example, a cheaper dye may be used in the resin and the cheaper dye may provide less attenuation than a more expensive dye. However, in order to minimize cross-talk, the distance 110 may need to be increased, resulting in the use of more of the filtering material 112, which in turn increases cost and impacts the footprint of the IC 100. One or more of the distances 110, 202, and 204 may be defined due to design parameters, and so the selection of the filtering material 112 may be made in light of the defined distances. Accordingly, many trade-offs may be considered when selecting the various factors that impact the level of attenuation provided to reduce cross-talk between the LED 102 and the photodetector 104.

The distances 202 and 204 may be controlled by varying the thickness of the IC package and the distance 110 may be controlled by varying the size of the package footprint. Generally, shorter distances 202, 204, and 110 result in less attenuation. In the present example, it is desirable to maximize the attenuation along the distance 110 and to minimize the attenuation along the distances 202 and 204. It is understood that the terms "maximize" and "minimize" may take into account many different factors, including factors not described in detail herein such as design or performance parameters, and so do not necessarily represent an actual maximum and minimum amount of attenuation that may be achieved based solely on the distances 110, 202, and 204 and the characteristics of the filtering material 112.

For example, the filtering material 112 may have a thickness of 0.25 millimeters (mm) over both the LED 102 and the photodetector 104, meaning that the distances 202 and 204 are 0.25 mm. The LED 102 and photodetector 104 may be positioned two mm apart, meaning that the distance 110 is two mm. This provides a ratio of 4:1 between the distances 202+204 and the distance 110. It is understood that this ratio is an example only and that the ratio may not scale linearly due to the logarithmic nature of Beer's Law and Lambert's Law. Furthermore, these distances are examples only, and the lateral distance may be as low as 0.4 or lower in some embodiments and the vertical distance may be as low as 0.15 mm or lower in some embodiments. The specific packaging requirements and the availability of higher resolution fabrication processes may increase or decrease the distances for a particular application and these minimum distance examples are not intended to limit the present disclosure.

In one embodiment, the vertical attenuation (i.e., the attenuation over the distances 202 and 204 when identical) may be in the range of twenty percent (20%) to eighty percent (80%). For example, the attenuation may be approximately fifty percent (50%), with around half of the light emitted by the LED 102 exiting the filtering material 112 into the environment. The lateral attenuation (i.e., the attenuation over the distance 110) may be at least seventy percent (70%), with less than thirty percent (30%) of the light emitted by the LED 102 reaching the photodetector 104 and causing cross-talk, although ninety percent (90%) or greater attenuation may be desirable for some applications. It is understood that these ranges are examples only and are not intended to limit the present disclosure. When the attenuation over the distances 202, 204, and 110 are taken together, the ratio of the distance 202+204 of the LED 102 and photodetector 104 to the environment (the optical signal) to the lateral distance between the LED 102 and photodetector 104 (the optical noise) may be viewed as representing the overall signal-to-noise ratio of the emitter/sensor system.

Figure 4A:
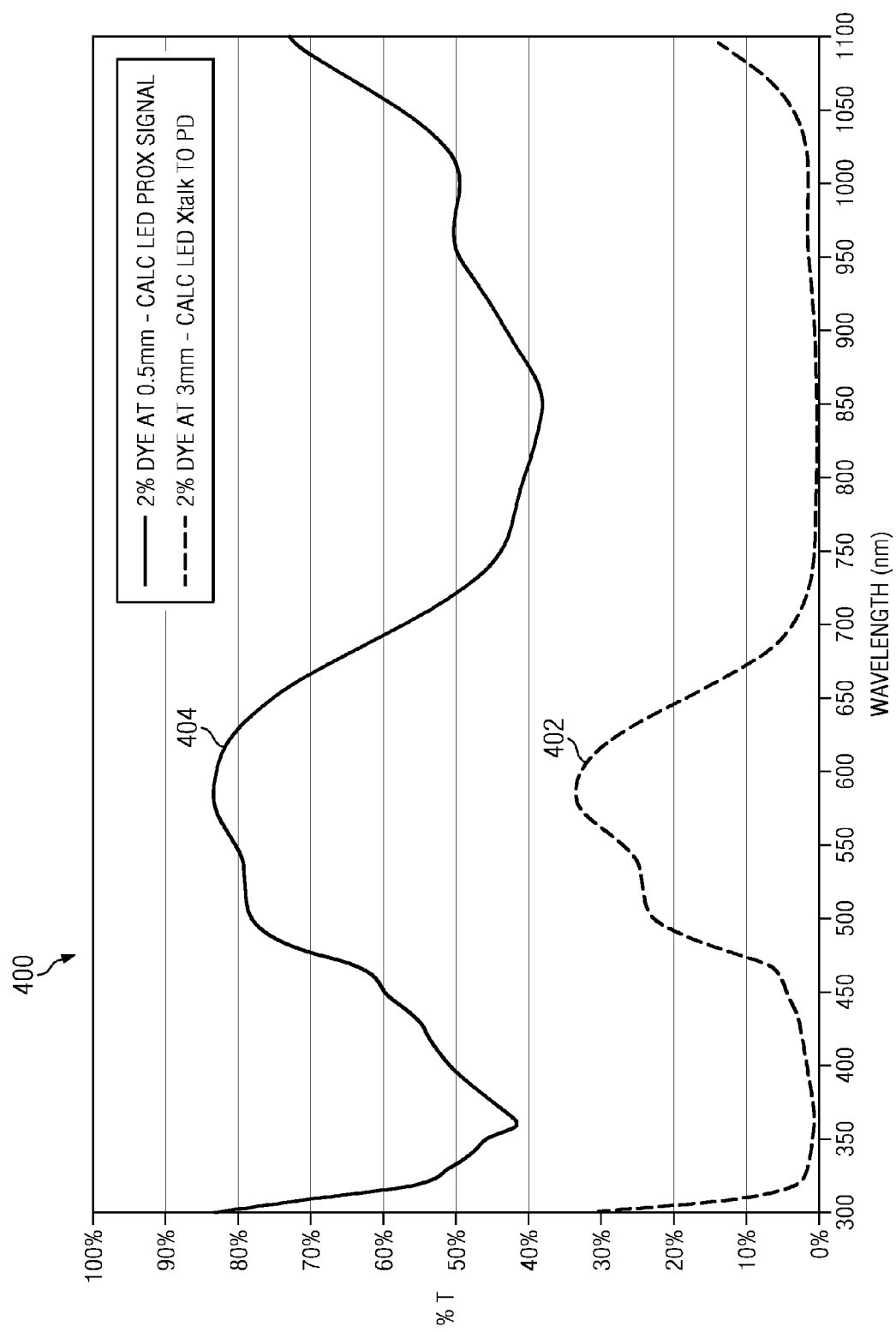
FIG. 4A is a graph illustrating one embodiment of transmission curve examples for a particular combination of filtering material and distance parameters.
Figure 4B:
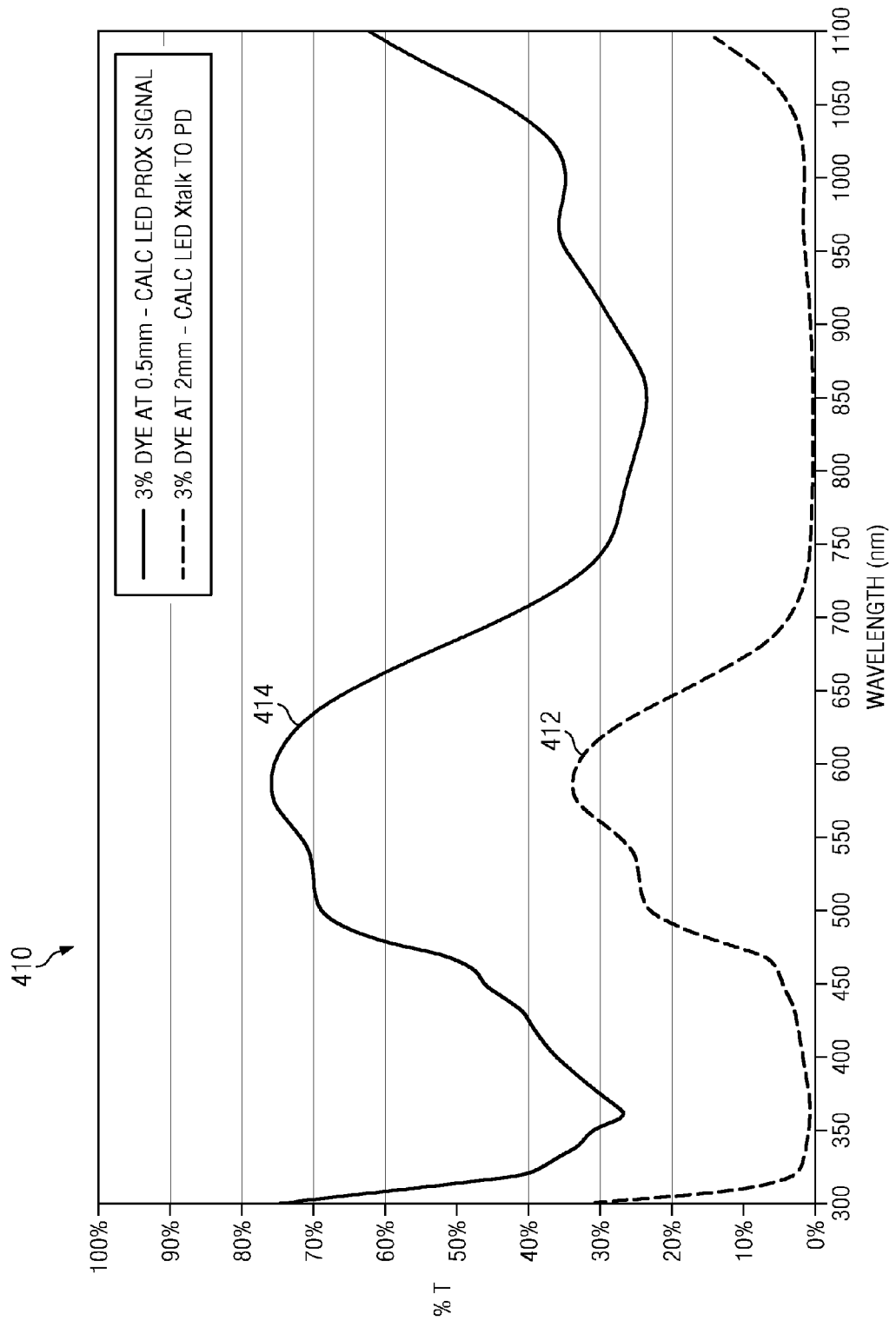
FIG. 4B is a graph illustrating another embodiment of transmission curve examples for a particular combination of filtering material and distance parameters.

Referring to FIGS. 4A and 4B, one example of the filtering material 112 may be a material such as Nitto Denko NT-MB-IRL3801 masterblend (e.g., resin with an IR-blocking dye) mixed with a two-component epoxy resin plus hardener. FIGS. 4A and 4B each illustrate embodiments of percent transmission curves for differing dye concentrations and differing distances 110. It is understood that FIGS. 4A and 4B illustrate how changes in parameters may affect the performance of the IC 100 and are not intended to limit the present disclosure.

More specifically, FIG. 4A is a graph 400 illustrating one embodiment of percent transmission curves for a two percent (2%) by weight concentration of the Nitto masterblend with a distance 110 of three mm and distances 202/204 of 0.25 mm each (for a total of 0.25+0.25=0.5 mm). The transmission curves are graphed against a vertical y-axis representing percent transmittance and a horizontal x-axis representing wavelength in nanometers. For purposes of example, the LED 102 emits near-IR light having a wavelength of 850 nm. A first transmission curve 402 represents crosstalk between the LED 102 and the photodetector 104. As can be seen by the transmission curve 402, there is approximately 99.7% attenuation of the cross-talk at 850 nm. A second transmission curve 404 represents attenuation of the signal over the combined distances 202 and 204 and there is approximately sixty-two percent (62%) attenuation at 850 nm.

FIG. 4B is a graph 410 illustrating another embodiment of percent transmission curves for a three percent (3%) by weight concentration of the Nitto masterblend with a distance 110 of two mm and distances 202/204 of 0.25 mm each (for a total of 0.25+0.25=0.5 mm). The transmission curves are graphed against a vertical y-axis representing percent transmission and a horizontal x-axis representing wavelength in nanometers. For purposes of example, the LED 102 emits near-IR light having a wavelength of 850 nm. A first transmission curve 412 represents crosstalk between the LED 102 and the photodetector 104. As can be seen by the transmission curve 412, there is approximately one hundred percent (100%) attenuation of the cross-talk at 850 nm. A second transmission curve 414 represents attenuation of the signal over the combined distances 202 and 204 and there is approximately seventy-seven percent (77%) attenuation at 850 nm.

Accordingly, based on variations in the distance 110 and dye concentration, FIGS. 4A and 4B illustrate two different resulting attenuation levels of both crosstalk and signal strength. In the present example, the three mm distance 110 and the two percent by weight concentration of FIG. 4A may be desirable due to the lower level of signal attenuation compared to the example of FIG. 4B while maintaining a high level of cross-talk attenuation. As the distance 110 and dye concentration may be varied within parameters defined by the particular packaging requirements for an application, a desired optimal combination may be identified for a particular combination of parameters. It is understood that variances in the distances 202 and/or 204, as well as other design considerations, may alter the optimal combination.

Figure 5:
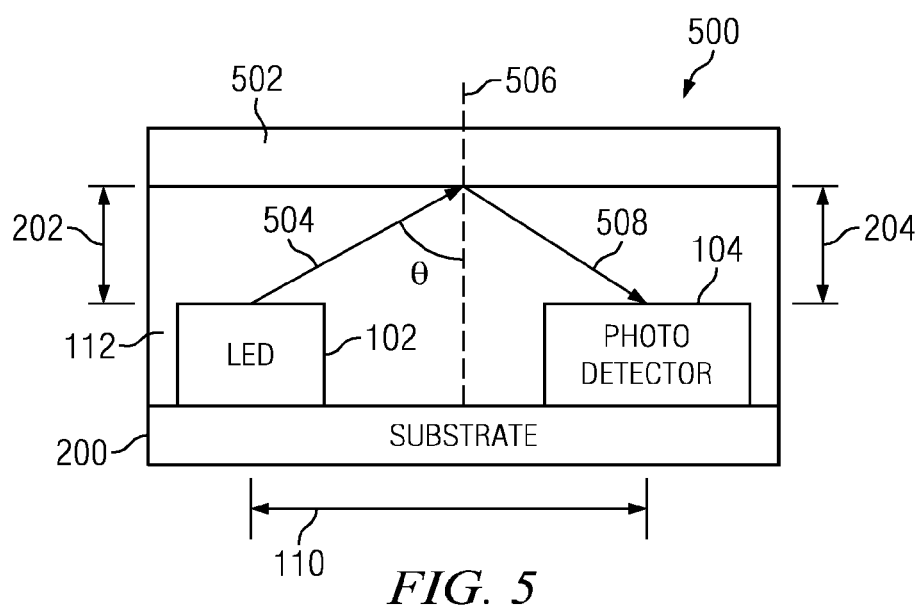
FIG. 5 is a simplified diagram of a side view of one embodiment of the IC of FIG. 1 with a covering layer.

Referring to FIG. 5, an embodiment of an IC 500 is illustrated. The IC 500 may be similar or identical to the IC 100 of FIG. 1 with the addition of a transparent or translucent covering layer 502 covering some or all of the filtering material 112. The covering layer 502 may be a plastic, a glass, or any other material and may be positioned directly against the filtering material 112 as shown in FIG. 5 or may be spaced from the filtering material 112 by an air interface or another material interface.

In the present example, the presence of the covering layer 502 may affect the selection of the distances 110, 202, and/or 204. The covering layer 502 may affect the distances due to an angle of incidence θ between a ray 504 emitted by the LED 102 and a line 506 that is perpendicular to the boundary between the covering layer 502 and the filtering material 112. As the angle of incidence increases, more internal reflection of the ray 504 will occur at the boundary between the covering layer 502 and the filtering material 112. The angle of incidence at which the ray 504 will undergo total internal reflection is known as the critical angle. Therefore, at angles of θ greater than the critical angle, the ray 504 will undergo total internal reflection at the boundary between the covering layer 502 and the filtering material 112 as illustrated by ray 508.

Accordingly, the distances 202, 204, and 110 may be selected based at least partly on the material characteristics of the covering layer 502 and the spacing of the covering layer 502 relative to the LED 102 and/or photodetector 104. For example, the material characteristics of the covering layer 502 and the spacing of the covering layer 502 relative to the LED 102 and/or photodetector 104 may be fixed for a particular application. As the covering layer 502 and the maximum distances 202/204 are fixed or fall within a defined range, the critical angle can be calculated for different values of the distance 110 to identify an angle of incidence that minimizes the amount of reflection from the LED 102 to the photodetector 104. As previously described, the distance 110 may have a limited range of possible values due to a maximum allowable footprint and so selection of the distance 110 would fall within the range of possible values.

Figure 6A:
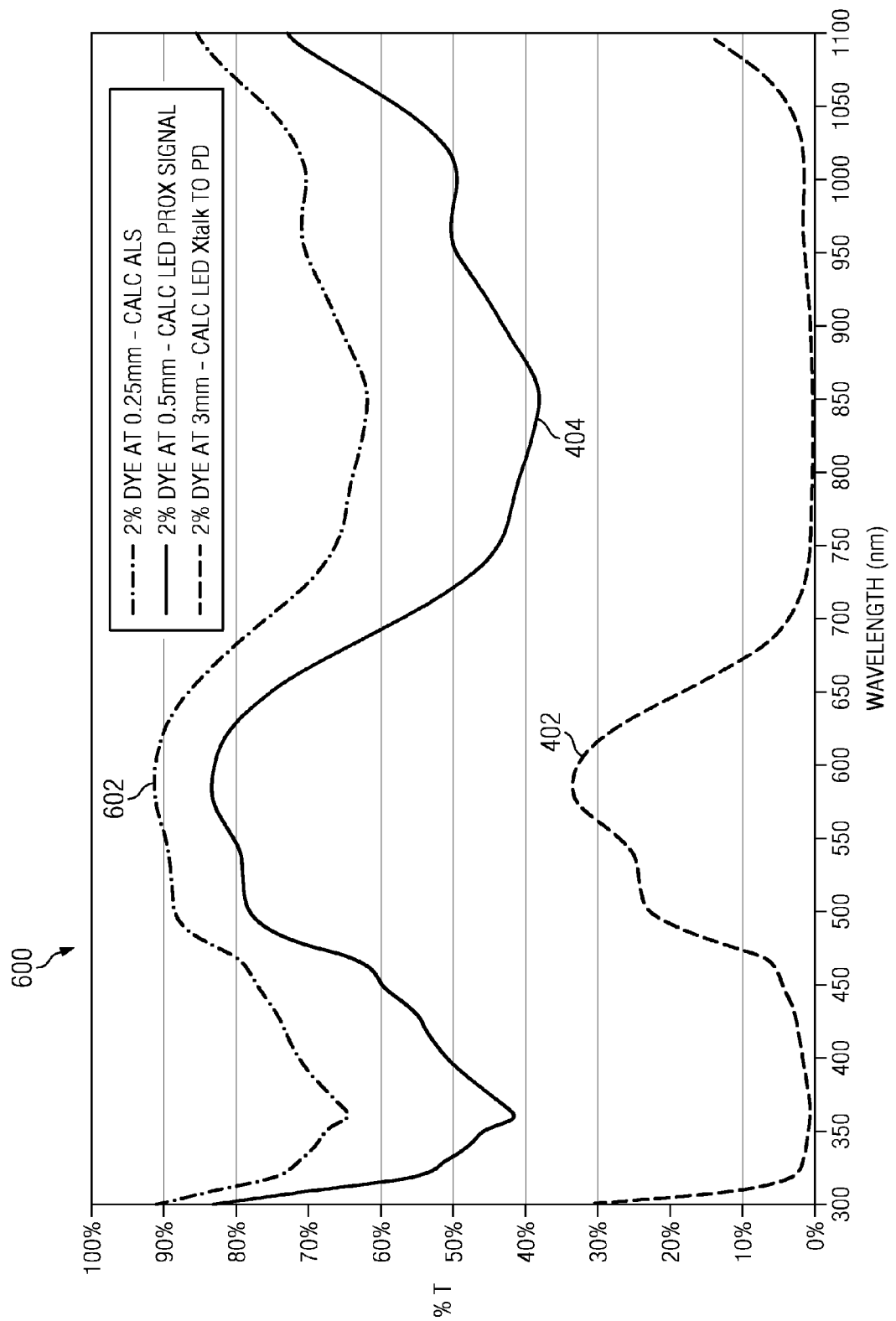
FIG. 6A is a graph illustrating one embodiment of transmission curve examples for a particular combination of filtering material and distance parameters for multiple functions.
Figure 6B:
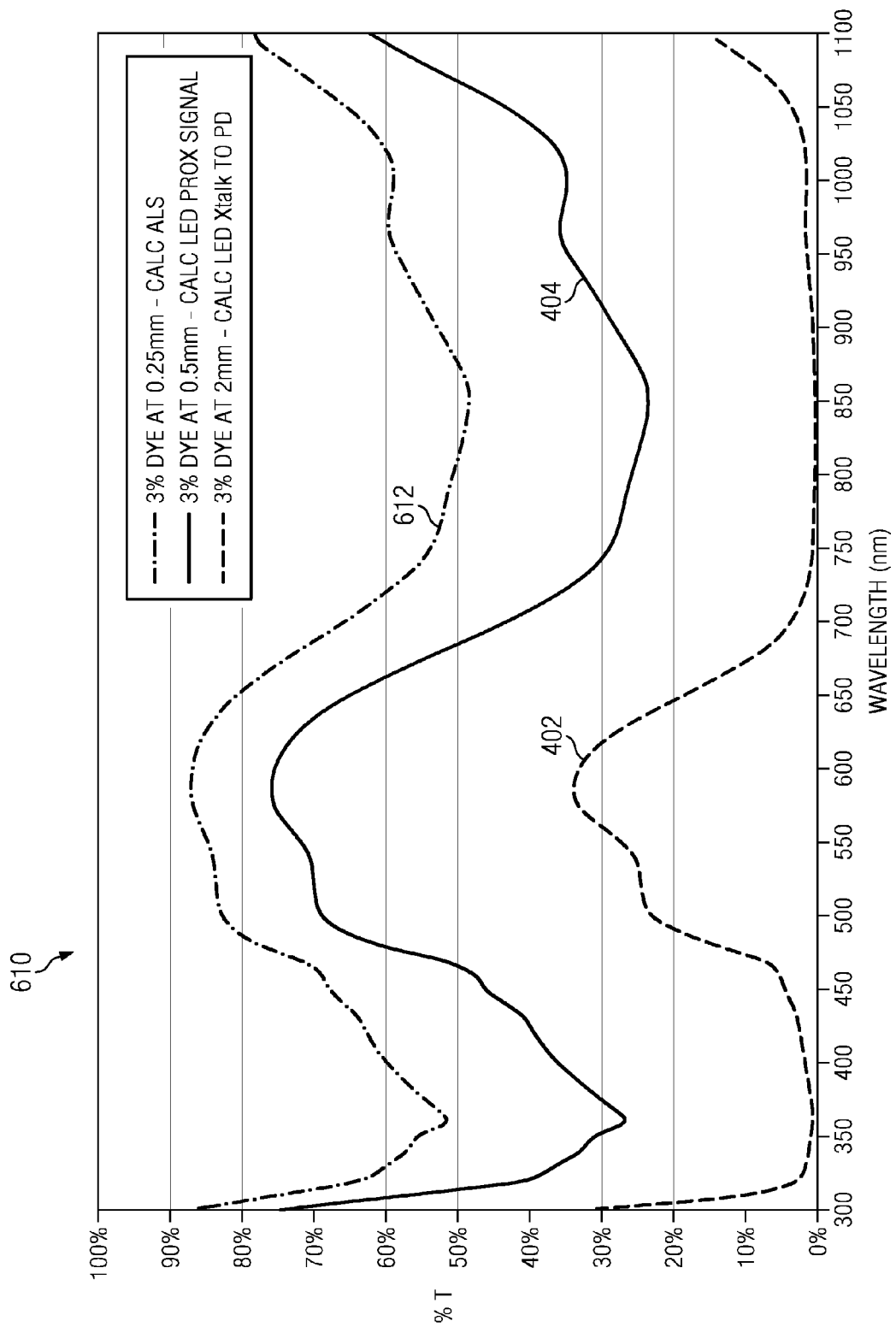
FIG. 6B is a graph illustrating another embodiment of transmission curve examples for a particular combination of filtering material and distance parameters for multiple functions.

Referring to FIGS. 6A and 6B, the percent transmission curves of FIGS. 4A and 4B, respectively, are illustrated with an additional transmission curve. The additional curve in each of FIGS. 6A and 6B represents an additional function that may play a role in the design of the IC 100 of FIGS. 1 and 2 and the IC 500 of FIG. 5. The performance of the additional function may need to be balanced against the signal strength represented by the transmission curves 404 and 414 when selecting the parameters for the IC package. For example, the photodetector 104 may be used for multiple purposes, such as detecting signals emitted by the LED 102 and also ambient light sensing (ALS) applications that detect ambient natural and/or artificial light. For purposes of illustration, the LED 104 emits near-IR light at a wavelength of 850 nm and the ALS is designed to sense light in the visible spectrum range of 400 to 700 nm. The applications using the photodetector 104 may obtain their particular wavelengths at different times, so incoming signals of 850 nm may be read at one time while incoming signals of 400-700 nm may be read at another time and/or filtered to remove extraneous wavelengths.

Accordingly, the various parameters used to select the filtering material 112 and/or distances 202, 204, and 110 may be modified to account for the performance of the photodetector 104 at both the near-IR wavelength of 850 nm and the visible light wavelengths of 400 to 700 nm. It is understood that FIGS. 6A and 6B illustrate how changes in parameters may affect the performance of the IC 100 and are not intended to limit the present disclosure.

More specifically, FIG. 6A is a graph 600 illustrating one embodiment of percent transmission curves for the two percent (2%) by weight concentration of the Nitto masterblend with identical distances 110, 202, and 204 as described with respect to FIG. 4A. For the visible wavelengths of 400-700 nm, a transmission curve 602 represents the attenuation of the visible light received by the photodetector 104. As can be seen, the attenuation ranges from approximately twenty-nine percent (29%) at 400 nm to approximately twenty-six percent (26%) at 700 nm, with a minimum level of attenuation of approximately nine percent (9%) at approximately 590 nm. It is noted that the cross-talk represented by the transmission curve 402 is significantly higher in the range of 400-700 nm than at 850 nm.

FIG. 6B is a graph 610 illustrating one embodiment of percent transmission curves for the three percent (3%) by weight concentration of the Nitto masterblend with identical distances 110, 202, and 204 as described with respect to FIG. 4B. For the visible wavelengths of 400-700 nm, a transmission curve 612 represents the attenuation of the ambient light received by the photodetector 104. As can be seen, the attenuation ranges from approximately forty percent (40%) at 400 nm to approximately thirty-four percent (34%) at 700 nm, with a minimum level of attenuation of approximately thirteen percent (13%) at approximately 590 nm. It is noted that the cross-talk represented by the transmission curve 412 is significantly higher in the range of 400-700 nm than at 850 nm.

Accordingly, based on variations in the distance 110 and dye concentration, FIGS. 6A and 6B illustrate two different results. In the present example, the three mm distance 110 and the two percent by weight concentration of FIG. 6A may be desirable due to the lower level of signal attenuation over the visible wavelength range of 400-700 nm compared to FIG. 6B. As the distance 110 and dye concentration may be varied within defined parameters, a desired optimal combination may be identified for a particular combination of parameters. While the cross-talk represented by the transmission curves 402/412 is significantly higher in the range of 400-700 nm than at 850 nm, this will not impact the readings at 850 nm since the readings are taken at different times and/or are filtered to remove extraneous wavelengths.

It is understood that variances in the distances 202 and/or 204, as well as other design considerations, may alter the optimal combination of parameters. While the transmission curves 404 and 602 and the transmission curves 414 and 612 provide desirable characteristics for both the proximity sensing with IR light and ALS applications, some applications may require more balancing in terms of trade offs. For example, some application pairs may have one set of parameters providing less attenuation at a first desirable wavelength while heavily attenuating a second desirable wavelength. Altering the parameters may shift the attenuation from the second desirable wavelength to the first desirable wavelength. Accordingly, a balance may be settled upon to enable a desirable level of performance at both of the first and second desirable wavelengths even if neither function is fully optimized. The functions to be balanced may include many different sensing applications such as proximity sensing, presence detection, motion detection, color detection, and/or ambient light sensing.

Figure 7:
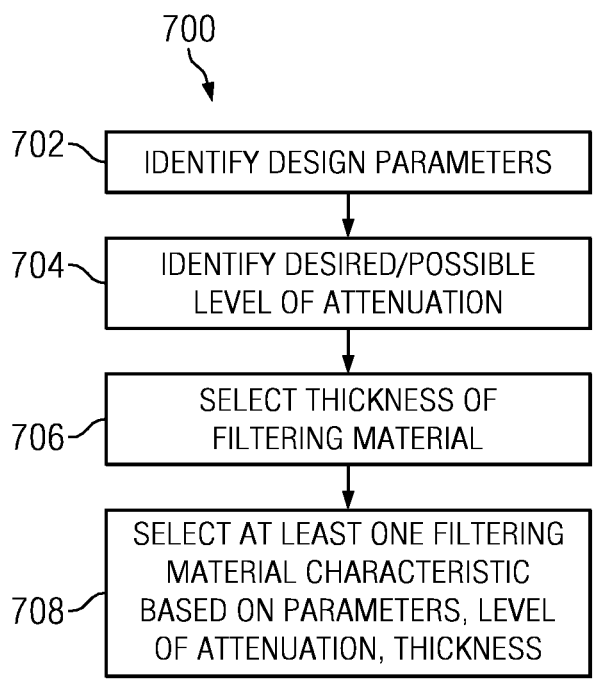
FIG. 7 is a flow chart illustrating one embodiment of a method for manufacturing the IC of FIG. 1.

Referring to FIG. 7, in another embodiment, a method 700 illustrates a process by which the IC 100 may be manufactured. It is understood that many different manufacturing processes may be used to form the IC 100 and that additional steps may be present that are not shown in FIG. 7. Furthermore, it is understood that the method 700 may be directed to design issues, rather than to the actual fabrication process of the IC 100, although fabrication steps may be included.

In step 702, one or more design parameters are identified. The design parameters may include cost, physical constraints (e.g., one or more of the distances 110, 202, and 204 and characteristics of the covering layer 502, such as thickness and material type), and any other factor that may play a role in the configuration of the IC 100. The identification may occur in a cascading fashion, with a single parameter (e.g., the distance 110) limiting choices in other areas. In other embodiments, multiple parameters may be selected and the remaining parameters may be limited based on those selections. Accordingly, it is understood that there may be many different parameters and that the identified parameters may vary in importance based on the particular IC 100.

In step 704, a desired and/or possible level of attenuation is identified. For example, a particular level of attenuation (e.g., ninety percent) may be desired to minimize cross-talk in order to achieve a desired level of sensitivity. This level of attenuation may be achievable in some embodiments due to a great enough distance 110, an appropriate type of resin/dye, small enough distances 202 and 204, and similar factors. However, in other embodiments, a desired level of attenuation may not be achievable. For example, cost constraints may require the use of a dye that provides less attenuation (e.g., eighty percent) while the distance 110 may be too small to offset the type of dye. Accordingly, the maximum or near-maximum possible level of attenuation (e.g., eighty percent) may be selected in this case rather than the desired level of attenuation.

It is understood that the signal attenuation for a given thickness of the filtering material 112 can be determined by calculation if the transmission properties of the filtering material 112 are known. The calculated signal attenuation can then be verified empirically by molding that thickness of the filtering material 112 and placing it over the photodetector 104 before performing a spectral scan of the photodetector's output.

In step 706, the thickness of the filtering material 112 (e.g., the distances 202 and 204) is selected. This step may be combined with step 702 as the identification of a design parameter or may be performed as illustrated. In some embodiments, the design parameters may identify a minimum and maximum range of thicknesses and a particular thickness may be selected from that range in step 706 based, for example, on the desired level of attenuation.

In step 708, at least one characteristic of the filtering material 112 may be selected based on the identified design parameters, level of attenuation, and thickness. The characteristic may include consistency and type of resin, the material used to form the resin, a dye type, dye concentration, and other factors that define the formulation and behavior of the filtering material 112.

Figure 8:
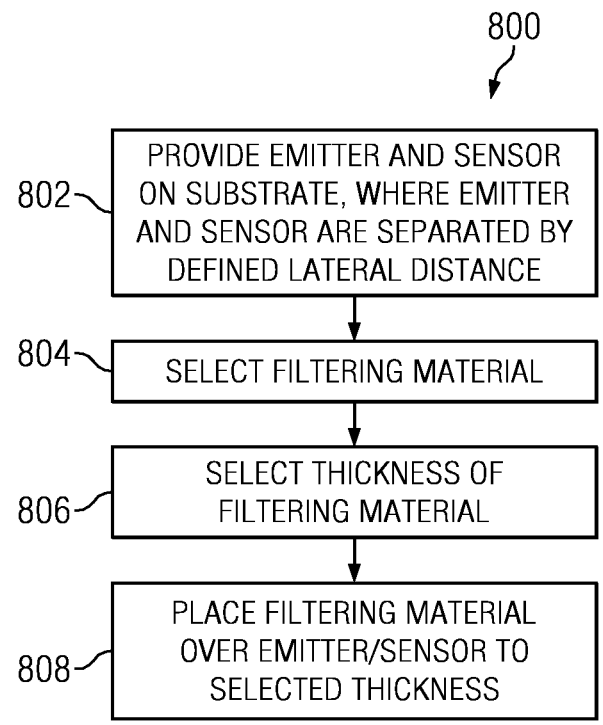
FIG. 8 is a flow chart illustrating another embodiment of a method for manufacturing the IC of FIG. 1.

Referring to FIG. 8, in another embodiment, a method 800 illustrates a process by which the IC 100 may be manufactured. It is understood that many different manufacturing processes may be used to form the IC 100 and that additional steps may be present that are not shown in FIG. 8.

In step 802, an emitter such as the LED 102 and a sensor such as the photodetector 104 are provided on the substrate 200. In some embodiments, the providing may include actual fabrication of any or all of the LED 102, photodetector 104, and substrate 200. In other embodiments, the providing may include using one or more pre-fabricated components that are coupled or otherwise positioned relative to the substrate 200.

In step 804, a filtering material 112 is selected. The selection may include selecting a pre-formulated filtering material 112 or may include selecting and/or combining various components in order to create the filtering material 112. For example, a resin may be selected and a dye may be added to the resin in order to achieve a desired attenuation characteristic for the resin.

In step 806, a thickness may be selected for the filtering material 112 and, in step 808, the filtering material 112 may be placed over at least one of the LED 102 and photodetector 104 to the selected thickness. In some embodiments, the placing may include various processing steps such as deposition, masking, lithography, and planarization. In other embodiments, the filtering material 112 may have a pre-fabricated shape and may be affixed to the IC 100 in the appropriate location. Accordingly, there are many different processes for creating and placing the filtering material 112 and the present disclosure is not limited to a particular process.

While the preceding description shows and describes one or more embodiments, it will be understood by those skilled in the art that various changes in form and detail may be made therein without departing from the spirit and scope of the present disclosure. For example, various steps illustrated within a particular flow chart may be combined or further divided. In addition, steps described in one flow chart may be incorporated into another flow chart. Therefore, the claims should be interpreted in a broad manner, consistent with the present disclosure.

What is claimed is:

1. A device comprising:
   a substrate;
   a light emitting diode (LED) positioned on the substrate;
   a photodetector positioned on the substrate at a distance from the LED, wherein the photodetector is configured to sense light emitted by the LED; and
   a filtering material that covers the LED and the photodetector by a first thickness and a second thickness, respectively, and is positioned between an external environment and the LED and photodetector, wherein the filtering material includes a resin with an optical filtering property that provides a first level of attenuation in light emitted from the LED in the direction of the photodetector and provides a second level of attenuation in light emitted from the LED in the direction of the external environment where the first level of attenuation is substantially higher than the second level of attenuation, and wherein the resin is configured to provide the first and second levels of attenuation based on the lateral distance and the first and second thicknesses.

2. The device of claim 1 wherein the filtering material further includes a dye having light attenuating characteristics.

3. The device of claim 1 wherein the first level of attenuation attenuates at least ninety percent of the light.

4. The device of claim 1 wherein the filtering material is a single layer of material deposited over the LED and the photodetector.

5. The device of claim 1 wherein the filtering material covering the LED is physically separate from the filtering layer covering the photodetector.

6. The device of claim 1 wherein the first and second thicknesses are identical.

7. The device of claim 1 wherein the LED is configured to provide light in the infrared spectrum and wherein the filtering layer includes an infrared blocking material.

8. The device of claim 1 wherein the LED is configured to provide light in the visible spectrum and wherein the filtering layer includes a visible light blocking material.

9. The device of claim 1 wherein the resin is an epoxy.

10. The device of claim 1 further comprising a covering layer positioned between the filtering material and the external environment.

11. The device of claim 3 wherein the second level of attenuation attenuates less than fifty percent of the light.

\* \* \* \* \*